(12) United States Patent
Chang et al.

(10) Patent No.: US 11,767,336 B2
(45) Date of Patent: Sep. 26, 2023

(54) ORGANOMETALLIC CLUSTER PHOTORESISTS FOR EUV LITHOGRAPHY

(71) Applicant: Taiwan Semiconductor Manufacturing Co., Ltd., Hsinchu (TW)

(72) Inventors: Hsu-Kai Chang, Hsinchu (TW); Chi-Ming Yang, Hsinchu (TW); Jui-Hsiung Liu, Hsinchu (TW); Jui-Hung Fu, Hsinchu (TW); Hsin-Yi Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/870,324

(22) Filed: Jul. 21, 2022

(65) Prior Publication Data
US 2022/0380392 A1    Dec. 1, 2022

Related U.S. Application Data

(62) Division of application No. 16/583,182, filed on Sep. 25, 2019, now Pat. No. 11,579,531.

(51) Int. Cl.
*C07F 7/22* (2006.01)
*G03F 7/004* (2006.01)
*G03F 7/36* (2006.01)
*G03F 7/20* (2006.01)
(Continued)

(52) U.S. Cl.
CPC .......... *C07F 7/2224* (2013.01); *G03F 7/0042* (2013.01); *G03F 7/30* (2013.01); *G03F 7/36* (2013.01); *G03F 7/2004* (2013.01); *G03F 7/325* (2013.01)

(58) Field of Classification Search
CPC ......... C07F 7/2224; G03F 7/0042; G03F 7/36
See application file for complete search history.

(56) References Cited

U.S. PATENT DOCUMENTS

| 2016/0116839 A1 | 4/2016 | Meyers et al. |
| 2019/0153001 A1 | 5/2019 | Cardineau et al. |

(Continued)

FOREIGN PATENT DOCUMENTS

| CN | 106588973 A | 4/2017 |
| JP | H04335074 A | 11/1992 |
| JP | H07258586 A | 10/1995 |

OTHER PUBLICATIONS

Tiekink, Edward RT. Structural chemistry of organotin carboxylates: a review of the crystallographic literature. Applied organometallic chemistry, 1991, 5. Jg., Nr.1, s. 1-23.

(Continued)

*Primary Examiner* — John S Chu
(74) *Attorney, Agent, or Firm* — SEED IP LAW GROUP LLP

(57) ABSTRACT

The present disclosure is directed to organotin cluster compounds having formula (I) and their use as photoresists in extreme ultraviolet lithography processes.

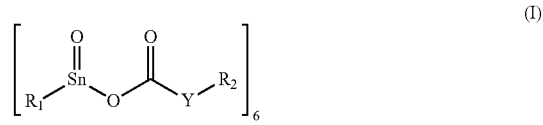

20 Claims, 7 Drawing Sheets

(51) Int. Cl.
  *G03F 7/32* (2006.01)
  *G03F 7/30* (2006.01)

(56) References Cited

U.S. PATENT DOCUMENTS

2019/0308998 A1  10/2019  Cardineau et al.
2021/0026241 A1   1/2021  Cardineau et al.

OTHER PUBLICATIONS

Sharps, Meredith C., et al. Implications of Crystal Structure on Organotin Carboxylate Photoresists. Crystal Research and Technology, 2017, 52. Jg., Nr.10, S. 1700081.

Xiao et al., Drumlike P-Methylphenyltin Carboxylates: The Synthesis, Characterization, Antitumor Activities and Fluorescence. *Journal of Molecular Structure*, vol. 1190, p. 116-124, 2019.

Jiang et al., Syntheses, Crystal Structures and Luminescent Properties of Drum and Ladder-Like Organooxotin Clusters with Carbazole Ligand. *J. Clust. Sci.*, vol. 28, p. 971-982, 2017.

Yin et al., Synthesis, Characterization and Structure of Drum Hexameric Benzyloxotin Heteroaromatic Carboxylates. *Indian Journal of Chemistry*, vol. 43B, p. 612-617, 2004.

Chandrasekhar et al., Multi-Functional Architectures Supported on Organostannoxane Scaffolds, *J. Chem. Sci.*, vol. 120, p. 105-113, 2008.

US 11,767,336 B2

ORGANOMETALLIC CLUSTER PHOTORESISTS FOR EUV LITHOGRAPHY

BACKGROUND

Semiconductor devices are used in a variety of electronic applications, such as personal computers, cell phones, digital cameras, and other electronic equipment. Semiconductor devices are fabricated by sequentially depositing dielectric layers, conductive layers, and semiconductor layers over a semiconductor substrate, and patterning the various material layers using photolithography. In a photolithography process, a photoresist is deposited over a substrate and is exposed to a radiation. The radiation exposure causes a chemical reaction in the exposed areas of the photoresist and creates a latent image corresponding to the mask pattern in the photoresist. The photoresist is next developed in a developer to remove either the exposed portions of the photoresist for a positive photoresist or the unexposed portions of the photoresist for a negative photoresist. The patterned photoresist is then used as an etch mask in subsequent etching processes, transferring the pattern to an underlying material layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
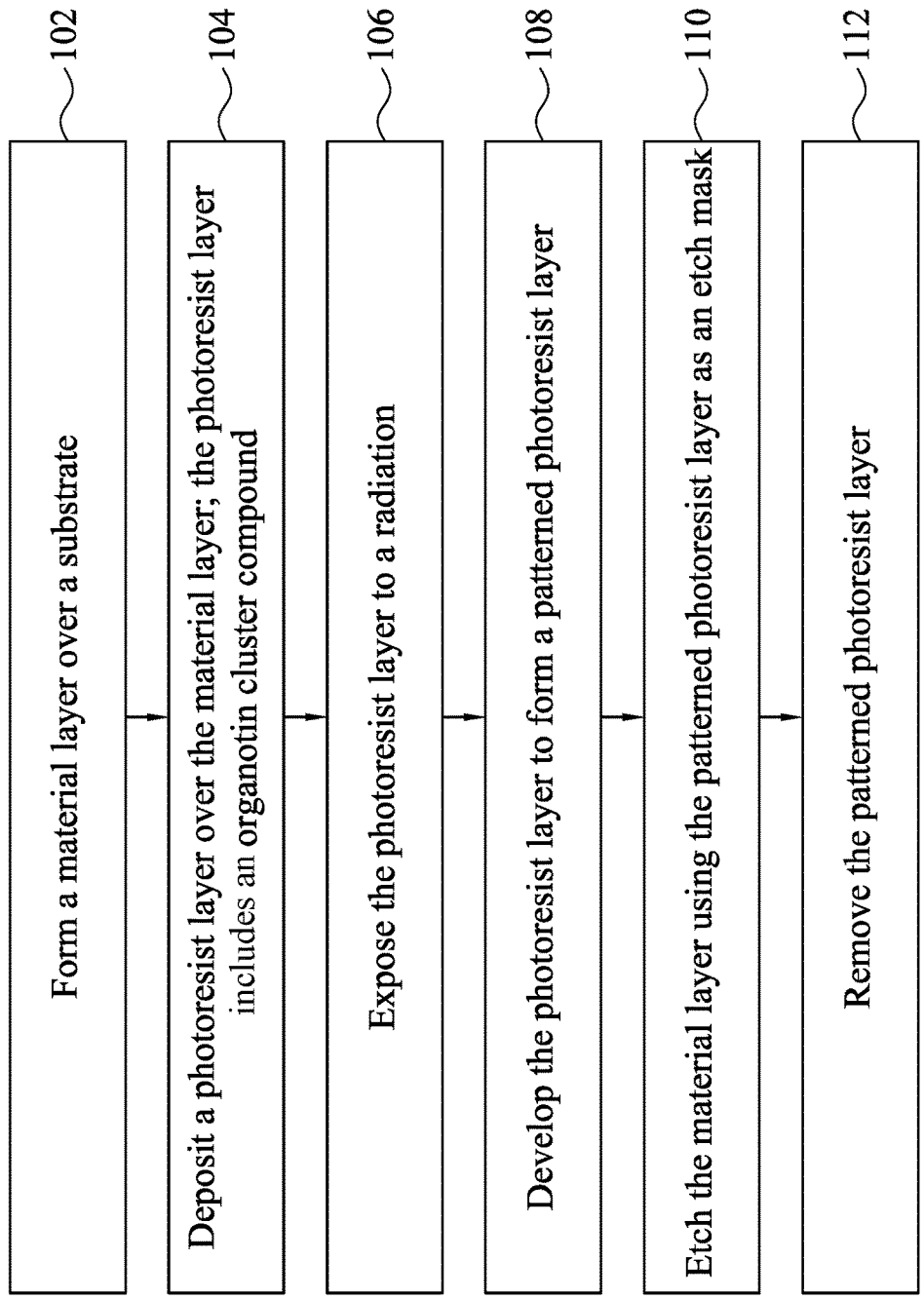
FIG. 1 is a flowchart of a method for forming a patterned structure on a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When describing the compounds, compositions, methods and processes of the present disclosure, the following terms have the following meanings, unless otherwise indicated.

As described herein, the compounds disclosed herein may optionally be substituted with one or more substituents, such as are illustrated generally below, or as exemplified by particular classes, subclasses, and species of the present disclosure. It will be appreciated that the phrase "optionally substituted" is used interchangeably with the phrase "substituted or unsubstituted." In general, the term "substituted" whether proceeded by the term "optionally" or not, refers to the replacement of one or more hydrogen radicals in a given structure with the radical of a specified substituent. Unless otherwise indicated, an optionally substituted group may have a substituent at each substitutable position of the group. When more than one position in a given structure can be substituted with more than one substituent selected from a specified group, the substituent may be either the same or different at each position.

The term "carbonyl" refers to the C=O substituent.

The term "oxo" refers to the =O substituent.

The term "nitro" refers to the $NO_2$ radical.

The term "alkyl" or "alkyl group" refers to a saturated linear or branched-chain monovalent hydrocarbon radical of 1 to 20 carbon atoms, wherein the alkyl radical may be optionally substituted independently with one or more substituents described herein. Unless otherwise specified, the alkyl group contains 1 to 20 carbon atoms. In some embodiments, the alkyl group contains 1 to 10 carbon atoms. In other embodiments, the alkyl group contains 1 to 8 carbon atoms. In still other embodiments, the alkyl group contains 1 to 6 carbon atoms. In yet other embodiments, the alkyl group contains 1 to 4 carbon atoms, and in further embodiments, the alkyl group contains 1 to 3 carbon atoms.

Some non-limiting examples of the alkyl group include methyl ($-CH_3$), ethyl ($-CH_2CH_3$), n-propyl ($-CH_2CH_2CH_3$), 2-propyl ($-CH(CH_3)_2$), n-butyl ($-CH_2CH_2CH_2CH_3$), 2-methyl-1-propyl ($-CH_2CH(CH_3)_2$), 2-butyl ($-CH(CH_3)CH_2CH_3$), t-butyl ($-C(CH_3)_3$), n-pentyl ($-CH_2CH_2CH_2CH_2CH_3$), 2-pentyl ($-CH(CH_3)CH_2CH_2CH_3$), 3-pentyl ($-CH(CH_2CH_3)_2$), 2-methyl-2-butyl ($-C(CH_3)_2CH_2CH_3$), 3-methyl-2-butyl ($-CH(CH_3)CH(CH_3)_2$), 3-methyl-1-butyl ($-CH_2CH_2CH(CH_3)_2$), 2-methyl-1-butyl ($-CH_2CH(CH_3)CH_2CH_3$), 1-hexyl ($-CH_2CH_2CH_2CH_2CH_2CH_3$), 2-hexyl ($-CH(CH_3)CH_2CH_2CH_2CH_3$), 3-hexyl ($-CH(CH_2CH_3)(CH_2CH_2CH_3)$), 1-heptyl, 1-octyl, and the like.

The prefix "alk-" refers to both straight chain and branched saturated carbon chain.

The term "alkylene" refers to a saturated divalent hydrocarbon group derived from a straight or branched chain saturated hydrocarbon by the removal of two hydrogen atoms. Unless otherwise specified, the alkylene group contains 1 to 6 carbon atoms. In some embodiments, the alkylene group contains 1 to 4 carbon atoms. In other embodiments, the alkylene group contains 1 to 2 carbon atoms. Some non-limiting examples of the alkylene group include methylene (—$CH_2$—), ethylene (—$CH_2CH_2$—), isopropylene (—$CH(CH_3)CH_2$—), and the like.

The term "alkoxy" refers to an alkyl group, as previously defined, attached to the principal carbon atom through an oxygen atom. Unless otherwise specified, the alkoxy group contains 1 to 20 carbon atoms. In some embodiments, the alkoxy group contains 1 to 10 carbon atoms. In other embodiments, the alkoxy group contains 1 to 8 carbon atoms. In still other embodiments, the alkoxy group contains 1 to 6 carbon atoms. In yet other embodiments, the alkoxy group contains 1 to 4 carbon atoms, and in further embodiments, the alkoxy group contains 1 to 3 carbon atoms.

Some non-limiting examples of the alkoxy group include methoxy (—$OCH_3$), ethoxy (—$OCH_2CH_3$), n-propoxy (—$OCH_2CH_2CH_3$), n-butoxy (—$OCH_2CH_2CH_2CH_3$), and the like.

The term "cycloalkyl" or "cycloalkyl group" refers to a monovalent or multivalent saturated ring having 3 to 12 carbon atoms as a monocyclic, bicyclic, or tricyclic ring system. A bicyclic ring system includes a spiro bicyclyl or a fused bicyclyl. In some embodiments, the cycloalkyl contains 3 to 10 carbon atoms. In still other embodiments, the cycloalkyl contains 3 to 8 carbon atoms, and in yet other embodiments, the cycloalkyl contains 3 to 6 carbon atoms. The cycloalkyl radical is optionally substituted independently with one or more substituents described herein.

Some non-limiting examples of the cycloalkyl group include cyclopropyl, cyclobutyl, cyclopentyl, cyclohexyl, and the like.

The term "aryl" or "aryl group" refers to monocyclic, bicyclic, and tricyclic carbocyclic ring systems having a total of 6 to 14 ring members, wherein at least one ring in the system is aromatic, and wherein each ring in the system contains 3 to 7 ring members and has one or more points of attachment to the rest of the molecule. The term "aryl" may be used interchangeably with the term "aryl ring."

Some non-limiting examples of the aryl ring would include phenyl, naphthyl, and anthracenyl. The aryl radical is optionally substituted independently with one or more substituents described herein.

The term "heteroatom" means one or more of oxygen, sulfur, nitrogen, phosphorus, or silicon, including any oxidized form of nitrogen, sulfur, or phosphorus; the quaternized form of any basic nitrogen; or a substitutable nitrogen of a heterocyclic ring, for example N (as in 3,4-dihydro-2H-pyrrolyl), NH (as in pyrrolidinyl) or NR (as in N-substituted pyrrolidinyl).

The term "haloalkyl" or "haloaryl" refers to alkyl or aryl, as the case may be, substituted with one or more halogen atoms.

The term "halogen" means fluorine (F), chlorine (Cl), bromine (Br) or iodine (I).

The term "halo" refers to bromo, chloro, fluoro or iodo.

The term "heterocycle," "heterocyclyl," or "heterocyclic" as used interchangeably herein refers to a monocyclic, bicyclic, or tricyclic ring system in which one or more ring members are independently selected from heteroatoms and that is completely saturated or that contains one or more units of unsaturation, but not aromatic, having one or more points of attachment to the rest of the molecule. A bicyclic ring system includes a spiro bicyclyl or a fused bicyclyl, and one of the rings can be either a monocarbocycle or a monohetercycle. One or more ring atoms are optionally substituted independently with one or more substituents described herein. In some embodiments, the "heterocycle," "heterocyclyl," or "heterocyclic" group is a monocycle having 3 to 7 ring members (2 to 6 carbon atoms and 1 to 3 heteroatoms selected from N, O, P, and S, wherein the S or P is optionally substituted with one or more oxo to provide the group SO or $SO_2$, PO or $PO_2$). In other embodiments, it is a monocycle having 3 to 6 ring members (2 to 5 carbon atoms and 1 to 2 heteroatoms selected from N, O, P, and S, wherein the S or P is optionally substituted with one or more oxo to provide the group SO or $SO_2$, PO or $PO_2$) or a bicycle having 7 to 10 ring members (4 to 9 carbon atoms and 1 to 3 heteroatoms selected from N, O, P, and S, wherein the S or P is optionally substituted with one or more oxo to provide the group SO or $SO_2$, PO or $PO_2$).

The heterocyclyl may be a carbon radical or heteroatom radical. Some nonlimiting examples of the heterocyclic ring include, pyrrolidinyl, tetrahydrofuranyl, dihydrofuranyl, tetrahydrothienyl, tetrahydropyranyl, dihydropyranyl, tetrahydrothiopyranyl, piperidino, morpholino, thiomorpholino, thioxanyl, piperazinyl, homo-piperazinyl, azetidinyl, oxetanyl, thietanyl, homopiperidinyl, oxepanyl, thiepanyl, oxazepinyl, diazepinyl, thiazepinyl, 2-pyrrolinyl, 3-pyrrolinyl, indolinyl, 2H-pyranyl, 4H-pyranyl, dioxanyl, 1,3-dioxolanyl, pyrazolinyl, dithianyl, dithiolanyl, dihydropyranyl, dihydrothienyl, dihydrofuranyl, pyrazolidinylimidazolinyl, imidazolidinyl, and 1,2,3,4-tetrahydro isoquinolinyl. Some nonlimiting examples of the heterocyclic group wherein 2 ring carbon atoms are substituted with oxo moieties are pyrimidindionyl and 1, 1-dioxothiomorpholinyl.

The term "heteroaryl" or "heteroaryl group" refers to monocyclic, bicyclic, and tricyclic ring systems having a total of 5 to 14 ring members, preferably, 5 to 12 ring members, and more preferably 5 to 10 ring members, wherein at least one ring in the system is aromatic, at least one ring in the system contains one or more heteroatoms, wherein each ring in the system contains 5 to 7 ring members and that has a one or more points of attachment to the rest of the molecule. In some embodiments, a 5 to 10 membered heteroaryl comprises 1, 2, 3 or 4 heteroatoms independently selected from O, S and N. The term "heteroaryl" may be used interchangeably with the term "heteroaryl ring" or the term "heteroaromatic." The heteroaryl radical is optionally substituted independently with one or more substituents described herein.

Some non-limiting examples of the heteroaryl ring include the following monocycles: 2-furanyl, 3-furanyl, N-imidazolyl, 2-imidazolyl, 4-imidazolyl, 5-imidazolyl, 3 isoxazolyl, 4-isoxazolyl, 5-isoxazolyl, 2-oxazolyl, 4-oxazolyl, 5-oxazolyl, N-pyrrolyl, 2-pyrrolyl, 3-pyrrolyl, 2-pyridyl, 3-pyridyl, 4-pyridyl, 2-pyrimidinyl, 4-pyrimidinyl, 5-pyrimidinyl, pyridazinyl (e.g., 3-pyridazinyl), 2-thiazolyl, 4-thiazolyl, 5-thiazolyl, tetrazolyl (e.g., 5-tetrazolyl), triazolyl (e.g., 2-triazolyl and 5-triazolyl), 2-thienyl, 3-thienyl, pyrazolyl (e.g., 2-pyrazolyl), isothiazolyl, 1,2,3-oxadiazolyl, 1,2,5-oxadiazolyl, 1,2,4-oxadiazolyl, 1,2,3-triazolyl, 1,2,3-thiadiazolyl, 1,3,4-thiadiazolyl, 1,2,5-thiadiazolyl, pyrazinyl, 1,3,5-triazinyl, and the following bicycles: benzimidazolyl, benzofuryl, benzothiophenyl, indolyl (e.g., 2-indolyl), purinyl, quinolinyl (e.g., 2-quinolinyl, 3-quinolinyl, 4-quinolinyl), and isoquinolinyl (e.g., 1-isoquinolinyl, 3-isoquinolinyl or 4-isoquinolinyl).

The continuous need to make feature sizes in integrated circuits smaller for enabling high integration densities and improved circuit function has necessitated the use of light of increasingly shorter wavelengths in photolithography patterning. Scaling features on advanced integrated circuits have driven lithography to use light sources in the extreme ultraviolet (EUV) range (13.5 nm or shorter) for producing features having line widths below 32 nm. The achievable patterning performance is integrally related to both the photoresist and the radiation source. Photoresists are being driven to provide high resolution and high sensitivity in EUV regime.

One type of photoresist used in EUV lithography is chemically amplified photoresists which use acid catalysis to increase sensitivity to exposure energy. A typical chemically amplified photoresist, for example, is formulated by dissolving an acid sensitive base polymer and a photoacid generator in a casting solution. The base polymer in a chemically amplified positive photoresist typically has acid labile groups bonded to the polymer backbone. When such a photoresist is exposed to radiation, the PAG absorbs photons and produces an acid. The photo-generated acid then causes catalytic cleavage of the acid labile groups. A single acid molecule generated in this manner may be capable of cleaving multiple acid labile groups on the base polymer. Thus, fewer photons are needed to render the exposed portion of the photoresist soluble or insuluable in the developer. However, photo-generated acids in exposed regions of the photoresist often diffuse into unexposed regions, causing blurring of the latent image and resulting in decrease of resolution and increase of line edge roughness. In addition, chemically amplified photoresists suffer from low etching resistance and do not possess sufficient etching selectivity to be used as an etch mask for etching a thick resist under layer, such as a spin-on carbon (SOC) layer. To overcome this issue, typical EUV lithography forms a thin hard mask layer between the resist pattern and the SOC under layer, and the resist pattern is used as an etch mask for etching the thin hard mask layer. The hard mask layer is then used as an etch mask to pattern the thick SOC layer, thus providing a SOC pattern with high aspect ratio suitable for subsequent etching of the substrate. However, the material and process associated with the additional hard mask layer increase the total manufacturing cost. Using the additional hard mask layer also leads to pattern-transfer errors because the extra layer, in some instances, causes undesired refraction when the chemically amplified photoresists is exposed. Furthermore, because the chemically amplified photoresists exhibit low absorption at EUV wavelengths, a relatively thick photoresist layer is needed to increase the sensitivity. With scaling of the feature size, the aspect ratio of the resist pattern becomes greater. The resist pattern with high aspect ratio tends to collapse easily. As a result, lithography performance is compromised or degraded. The sensitivity, resolution and etch selectivity properties of chemically amplified photoresists are, thus, insufficient to reach advanced pitch target (e.g., below 32 nm) in EUV lithography.

In some embodiments, a series of organometallic cluster compounds with high EUV optical density are provided as photoresists for EUV lithography. In some embodiments, the organometallic cluster compounds are organotin cluster compounds including a core of six tin (Sn) atoms and bridging oxo and carboxylate ligands. Due to high absorption cross sections of tin and carboxylic ligands in the EUV region which eliminates the needs of using mobile photoacid generator and relatively small molecular size, when the organotin cluster compounds of the present disclosure are used as EUV photoresists, patterned features with both improved line edge roughness and resolution can be obtained. The organotin cluster compounds of the present disclosure thereby help to improve patterning performance. In addition, because the organotin cluster compounds of the present disclosure possess superior etching resistance compared to conventional chemically amplified photoresists, the organometallic clusters of the present disclosure are able to be used as an etch mask to directly etch the SOC under-layer without the need of using the extra hard mask layer. As a result, the manufacturing cost is reduced.

The organometallic cluster compounds of the present disclosure are represented by formula I:

$$[R_1Sn(O)X]_6 \quad (I)$$

In some embodiments, $R_1$ is an alkyl group or an optionally substituted aryl group. Examples of alkyl groups include methyl, ethyl, or butyl. In some embodiments, $R_1$ is an n-butyl group. Examples of aryl groups include phenyl, naphthyl, and anthracenyl. In some embodiment, $R_1$ is an alkyl substituted aryl group.

X is a ligand having high radiation sensitivity in the radiation range. In some embodiments, X is a ligand having a high radiation sensitivity in the EUV range. In some embodiments, X is a conjugate base of an acid. In some embodiments, X is a conjugate base of an organic carboxylic acid and is represented by formula (II):

$$R_2\text{—}Y\text{—}COO^- \quad (II)$$

$R_2$ is selected to provide high radiation sensitivity in the EUV range and to provide solubility control. In some embodiments, $R_2$ is a substituted aryl group. Examples of aryl groups include phenyl, naphthyl, and anthracenyl. Examples of substituents include one or more halo groups such as one or more chloro groups or one or more nitro groups. In some embodiments, $R_2$ is a chloro-substituted phenyl group. In some embodiments, $R_2$ is an optionally substituted heteroaryl group. Examples of heteroaryl groups includes a triazolyl group and a thienyl group. In some embodiments, the heteroaryl is substituted with an alkyl group containing from 1 to 20 carbon atoms or an aryl group optionally substituted with one or more alkyl, alkoxy, or halo groups.

Y is a linking group including an alkylene group containing from 1 to 6 carbons or a carbonyl group. Examples of alkylene groups include methylene, ethylene, and propylene. In some embodiments, the linking group Y is a methylene group.

In some embodiments, X is one of the carboxylate ligands shown below:

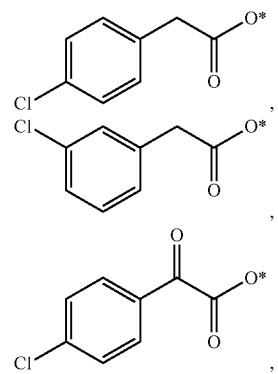

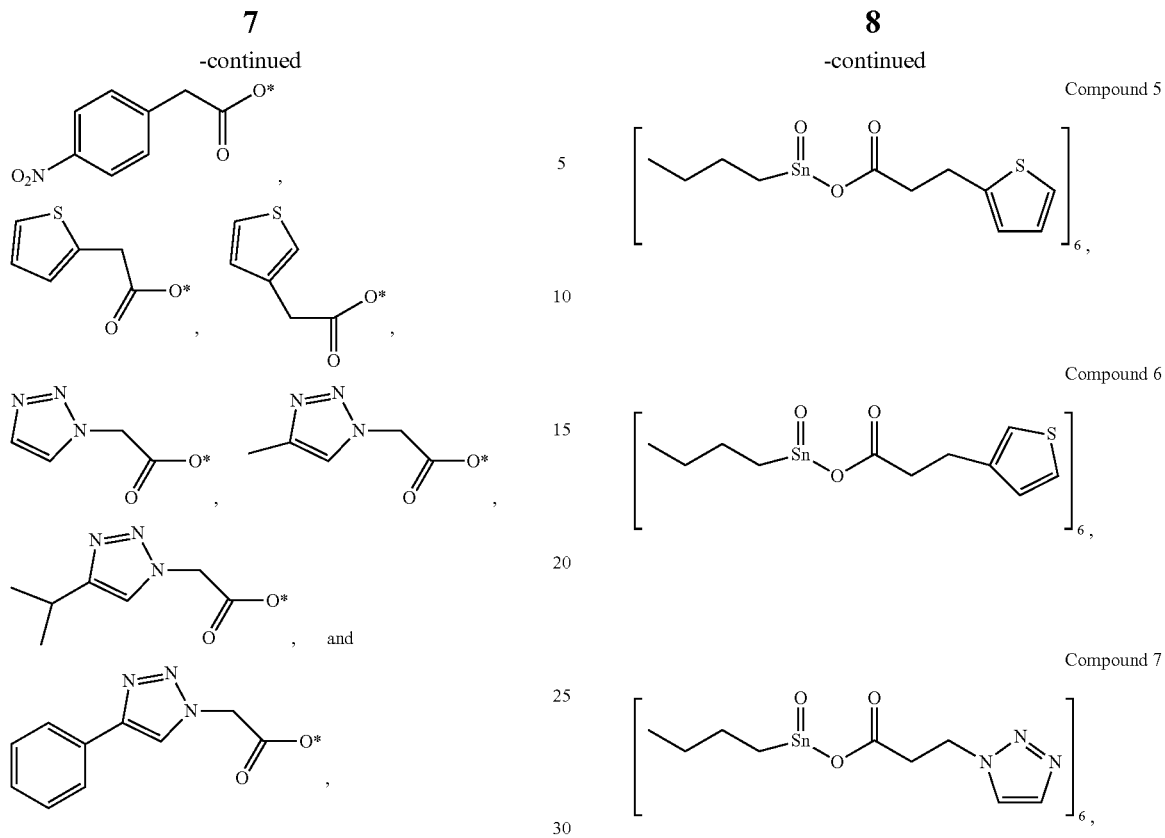
where the * denotes a point of attachment.
Some particular examples of organotin cluster compounds according to the present disclosure include:
The molecular structure of organotin cluster compounds of the present disclosure determined by single-crystal X-ray diffraction studies is shown below:

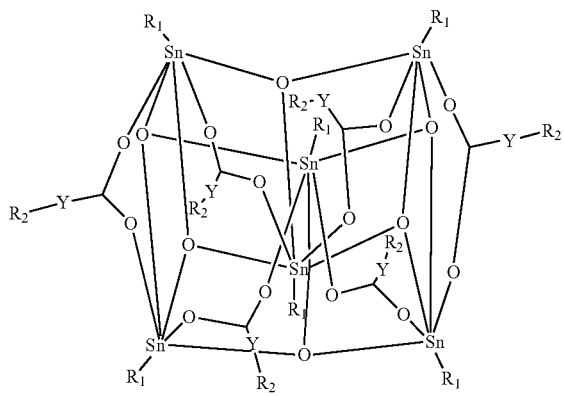

The organotin cluster compounds are a drum-like hexameric cluster. As shown, all the six tin atoms in an organotin cluster compound are chemically equivalent. Each tin is hexacoordinated with three of the coordination sites occupied by bridging tri-coordinate oxygen atoms, two coordination sites occupied by carboxylate ligands with oxygen atoms forming the bridging, and one coordination site occupied by the functional group $R_1$ covalently bonded to tin. The organotin hexameric cluster is built around a drum shaped $Sn_6O_6$ central stannoxane core that is made up of two hexamer $Sn_3O_3$ rings. These hexameric $Sn_3O_3$ rings exist in a puckered chair conformation and form the upper and lower lids of the drum polyhedron. The two $Sn_3O_3$ rings are connected further by six Sn—O bonds containing tri-coordinate O atoms and, thus, the side faces of the drum are characterized by six four-membered $Sn_2O_2$ rings. The two tin atoms in each of the six $Sn_2O_2$ rings are bridged by a carboxylate ligand to form a symmetrical bridge between two carboxylate ligands.

The dimension of the organotin cluster compounds of the present disclosure is adjustable by varying the size of the organic carboxylate ligands. In some embodiments, the dimension of the organotin cluster compounds is from about 0.5 nm to 10 nm. If the dimension of the organotin cluster compounds is too great, the sharpness of the pattern formed by crosslinking of the organotin cluster compounds is insufficient, in some instances. If the dimension of the organotin cluster compounds is too small, tin oxide ($SnO_x$) formed by the crosslinking of the organotin cluster compounds is easily dissolved by the developer. The organotin cluster compounds, thus, possess insufficient activity in the exposure operation, in some instances. In some embodiments, the dimension of the organotin cluster compounds is from about 0.5 nm to about 1.0 nm to provide patterned features with line widths less than about 32 nm.

In some embodiments, the organotin cluster compounds of the present disclosure are synthesized by condensing a tin hydroxide oxide hydrate ($R_1SnOOH$) with an organic carboxylic acid ($R_2YCOOH$) as shown in the general reaction scheme 1 below.

Scheme 1

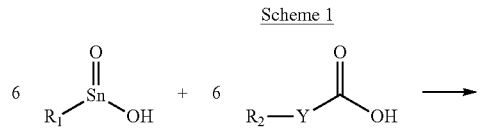

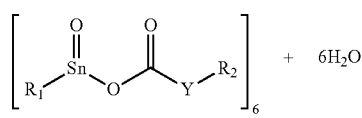

In some embodiments, $R_1$ is an alkyl group or an optionally substituted aryl group. Examples of alkyl group include methyl, ethyl, or butyl. In some embodiments, $R_1$ is an n-butyl group. Examples of aryl group include phenyl, naphthyl, and anthracenyl. In some embodiment, $R_1$ is an alkyl substituted aryl group.

$R_2$ is selected to provide high radiation sensitivity in the EUV range and to provide solubility control. In some embodiments, $R_2$ is a substituted aryl group. Examples of aryl groups include phenyl, naphthyl, and anthracenyl. Examples of substituents include one or more halo groups such as one or more chloro groups or one or more nitro groups. In some embodiments, $R_2$ is a chloro-substituted phenyl group. In some embodiments, $R_2$ is an optionally substituted heteroaryl group. Examples of heteroaryl groups includes a triazolyl group and a thienyl group. In some embodiments, the heteroaryl is substituted with an alkyl group containing from 1 to 20 carbon atoms or an optional substituted aryl group.

Y is a linking group including an alkylene group containing from 1 to 6 carbons or a carbonyl group. Examples of alkylene groups include methylene, ethylene, and propylene. In some embodiments, the linking group Y is a methylene group.

In some embodiments, the organic carboxylic acid is one of compounds shown below:

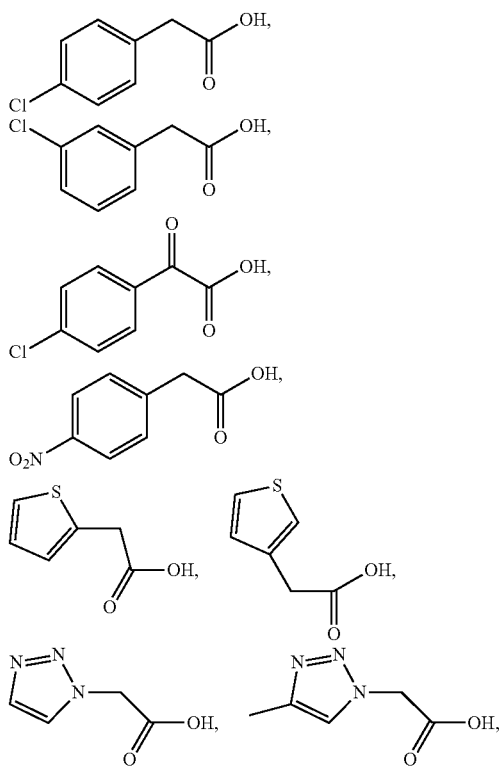

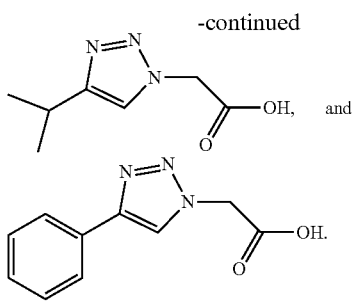

-continued

The reaction between the organotin hydroxide oxide hydrate and carboxylic acid in a boiling solvent proceeds via azeotropic removal of water to afford the organotin cluster compound. The condensation reaction is performed in a flask equipped with a stir bar, Dean-Stark apparatus water trap and a condenser. An organotin hydroxide oxide hydrate (e.g., butyltin hydroxide oxide hydrate) and an organic carboxylic acid are first suspended in a solvent (e.g., benzene or toluene). The reaction mixture is heated and maintained at reflux for about 1 hour to 12 hours, during which water is collected in the Dean-Stark apparatus. After the formation of water stops, the reaction mixture is cooled and filtered. The solvent in the solution portion obtained is evaporated under reduced pressure to yield a pale amorphous crude product. The collected solid is recrystallized for purification, generally from an organic solvent by heating the solvent to dissolve the solid and slowly allowing the solution to cool. Suitable solvents for recrystallization include, but are not limited to, hexane, chloroform, tetrahydrofuran (THF), benzene, and toluene. The recrystallized solid is dried to yield a crystalline product.

The molar ratio of the organotin hydroxide oxide hydrate and the organic carboxylic acid is set to obtain 6-Sn cluster compounds with high purity. In some embodiments, the molar ratio of the reactants, i.e., organotin hydroxide oxide hydrate and organic carboxylic acid are set to be at a 1:1 ratio. Nonequivalent molar ratio of reactants (e.g., an amount of one reactant is more than an amount of the other reactant) sometimes makes it difficult to purify the final products. The reaction to form the organotin cluster compounds is conducted at a temperature greater than the reflux temperature. If the temperature of the reaction is lower than the reflux temperature, a condensation reaction cannot occur, leading to an incomplete reaction in the synthesis of the organotin cluster compounds with six tin atoms in the core center. The reaction time is determined by the bulkiness of the organic carboxylic acid. A bulkier organic carboxylic acid normally leads to a longer reaction time for the condensation reaction to complete. The reaction is conducted for a time period that allows the condensation reaction to complete. If the reaction time is too short, an incomplete reaction occurs which results in a low reaction yield, in some instances. If the reaction time is too long, the risk of the decomposition of the 6-Sn cluster compound increases, in some instances.

The present disclosure also provides a photoresist composition for forming a photoresist layer for EUV lithography. In some embodiments, the photoresist composition includes an organometallic cluster compound of Formula I.

The photoresist composition further includes a solvent which is capable of dissolving the organotin cluster compound of the present disclosure. Examples of such solvents include, but are not limited to alcohols, aromatic hydrocarbons, and the like. A solvent system including a mixture of the aforementioned solvents is also contemplated. Examples of alcohols include, but are not limited to, methanol, ethanol, n-propanol, isopropanol, 1-methoxy-2-propanol, 1-butanol, 4-methyl-2-pentanol, and cyclopentanol. Examples of aromatic hydrocarbons include, but are not limited to, xylene, toluene and benzene. In some embodiments, the solvent is selected from at least one of methanol, 4-methyl-2-pentanol and xylene.

The concentration of the organotin cluster compounds in the photoresist composition is selected to achieve desired physical properties of the solution. In some embodiments, the concentration of the organometallic cluster compound in the photoresist composition is in a range from about 0.5 wt. % to 10 wt. %. If the concentration of the organometallic cluster material is too great, the risk of crystallization of organometallic cluster compound in the solvent increases. If the concentration of the organometallic cluster compound in the photoresist composition is too small, the amount of the organometallic cluster compound is not sufficient to absorb enough light, which results in poor exposure effect. In some embodiments, the concentration of the organometallic cluster material in the photoresist composition is in a range from about 1 wt. % to 5 wt. % to provide good film forming property and patterning performance.

The photoresist composition is prepared by mixing an organotin cluster compound in a solvent using appropriate mixing apparatus. Suitable filtration is used to remove any contaminants or other components that do not appropriately dissolve.

The photoresist composition of the present disclosure is usable to form a photoresist coating in lithographic processes and to be used as an etch mask to create patterned features such as fins, metal lines with line widths less than about 32 nm.

FIG. 1 is a flowchart of a method 100 of forming a patterned structure on a substrate using the photoresist composition described above, in accordance with some embodiments. FIGS. 2A through 2F are cross-sectional views of a semiconductor structure 200 at various fabrication stages, in accordance with some embodiments. The method 100 is described below in conjunction with FIG. 1 and FIGS. 2A through 2F wherein the semiconductor structure 200 is fabricated by using embodiments of the method 100.

Figure 2A:
FIG. 2A is a cross-sectional view of a semiconductor structure after forming a material layer over a substrate, in accordance with some embodiments.
Figure 2A:
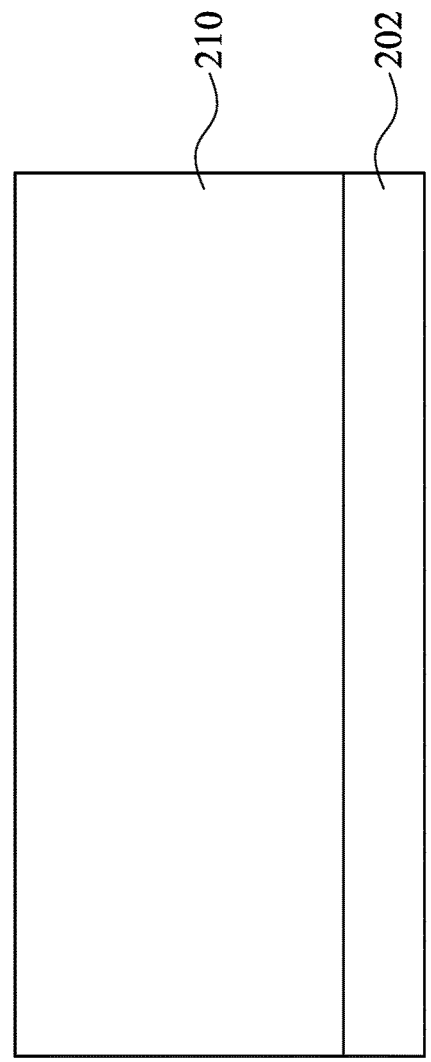

Referring to FIG. 1, the method 100 includes operation 102, in which a material layer 210 is deposited over a substrate 202. FIG. 2A is a cross-sectional view of a semiconductor structure 200 after forming the material layer 210 over the substrate 202

Referring to FIG. 2A, the substrate 202 is provided. The substrate 202 is any substrate that is used in processes involving photoresists. In some embodiments, the substrate 202 is a bulk semiconductor substrate including silicon. Alternatively or additionally, in some embodiments, the bulk semiconductor substrate includes another elementary semiconductor such as germanium, a compound semiconductor including gallium arsenide, gallium, phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 202 includes an epitaxial layer. For example, the substrate 202 has an epitaxial layer overlying a bulk semiconductor substrate. Furthermore, in some embodiments, the substrate 202 is a semiconductor on insulator (SOI) substrate. For example, the substrate 202 includes a buried oxide (BOX) layer formed by a process such as separation by implanted oxygen (SIMOX) or other suitable techniques, such as wafer bonding and grinding.

In some embodiments, the substrate 202 further includes active devices such as p-type field effect transistors (PFET), n-type FET (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 202 further includes passive devices such as resistors, capacitors, and/or inductors. The substrate 202 further includes isolation structures such as shallow trench isolation (STI) structures to separate various active and/or passive devices from one another.

The material layer 210 is formed over the substrate 202. The material layer 210 is a conductive layer, a dielectric layer, a semiconductor layer or other material layers depending on the stage of the manufacturing processes. In some embodiments, the material layer 210 includes a dielectric material such as silicon dioxide, silicon nitride, silicon oxynitride, silicon carbonitride, silicon boronitride, silicon borocarbide, a spin-on-carbon (SOC), a low-k dielectric material, or a combination thereof. Examples of low-k dielectric materials include, but are not limited to, a fluoride-doped silicon oxide (e.g., fluoride doped glass), a carbon doped silicon oxide, a porous silicon oxide, a spin-on silicon based polymeric material such as tetraethyl orthosilicate (TEOS), hydrogen silsesquioxane (HSQ) and methylsilsesquioxane (MSQ), or combinations thereof. In some embodiments, the material layer 210 includes a metal oxide such as titanium oxide ($TiO_x$), molybdenum oxide ($MoO_x$), and hafnium oxide ($HfO_x$); a metal nitride such as titanium nitride ($TiN_x$), molybdenum nitride ($MoN_x$), and tantalum nitride ($TaN_x$); or a metal carbide such as titanium carbide ($TiC_x$) and tantalum carbide ($TaC_x$). In some embodiments, the material layer 210 is deposited any suitable deposition process such as, for example, chemical vapor deposition (CVD), physical vapor deposition, plasma-enhanced chemical vapor deposition (PECVD), atomic layer deposition (ALD), or spin coating. In some embodiments, the material layer 210 is deposited to have a thickness ranging from about 50 nanometer (nm) to about 300 nm. If the thickness of the material layer 210 is too small, the risk of the material layer 210 being removed during the removal of the patterned photoresist layer increases, in some instances. If the thickness of the material layer 210 is too great, production costs are increased as a result of unnecessary consumption of material and increased processing time to pattern the material layer 210, in some instances.

Figure 2B:
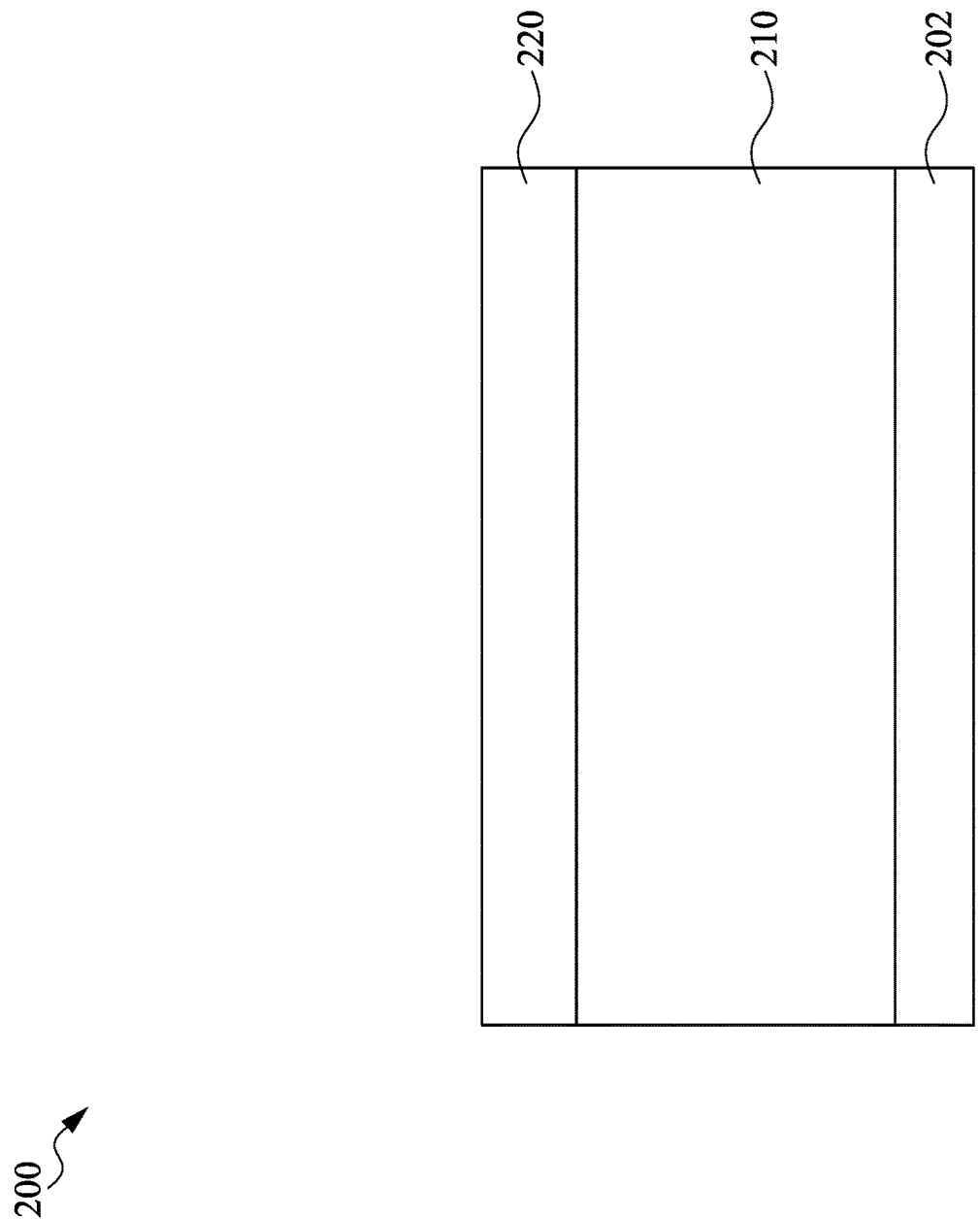
FIG. 2B is a cross-sectional view of the semiconductor structure of FIG. 2A after depositing a photoresist layer over the material layer, in accordance with some embodiments.

Referring to FIG. 1, the method 100 proceeds to operation 104, in which a photoresist layer 220 is deposited over the material layer 210. FIG. 2B is a cross-sectional view of the semiconductor structure 200 of FIG. 2A after depositing the photoresist layer 220 over the material layer 210.

Referring to FIG. 2B, the photoresist layer 220 is deposited over the material layer 210 by a coating process. Examples of coating processes include, but are not limited to, spin coating, spray coating, dip coating, screen printing, and inject printing. In some embodiments, the photoresist layer 220 is formed by spin coating the photoresist composition described over the material layer 210. The photoresist composition includes an organometallic cluster compound of Formula I and a solvent such as methanol, 4-methyl-2-pentanol, or xylene. During the spin coating process, the substrate 202 is spun to spread the photoresist composition across the material layer 210. The spin speed is adjusted to obtain a desired coating thickness. In some embodiments, the spin coating is performed at a rate from about 500 rpm to about 10,000 rpm. In some embodiments, an initial low spin speed, e.g., at 50 rpm to 250 rpm, is used to perform an initial bulk spreading of the photoresist composition across the material layer. In some embodiments, the spin coating is performed for times from about 5 seconds to about 5 minutes.

The thickness of the photoresist layer 220 is determined by the concentration of the photoresist composition, the viscosity of the photoresist composition, and the spin seed for spin coating. In some embodiments, the thickness of the photoresist layer 220 is from about 1 nm to about 550 nm, and in further embodiments, from about 10 nm to 100 nm. If the thickness of the photoresist layer 220 is too great, production costs are increased as a result of unnecessary consumption of organometallic cluster material and increased processing time to etch the photoresist layer 220, in some instances. If the thickness of the photoresist layer 220 is too thin, the risk of the photoresist layer 220 being removed before the patterning of the material layer 210 completes increases, in some instances. Due to the relatively high etching resistance and radiation sensitivity of the organotin cluster compounds comparing to the polymer-based photoresists, the photoresist layer 220 of the present disclosure is able to be formed to have a thickness less than the thickness of the polymer-based photoresist layer. The organotin cluster compounds, thus, help to prevent pattern collapse.

After depositing the photoresist layer 220, the photoresist layer 220 is subjected to a soft bake process that removes the solvent from the photoresist layer 220. In some embodiments, the soft bake is conducted at a temperature ranging from 50° C. to about 150° C. for a duration from about 30 seconds to about 300 seconds.

Figure 2C:
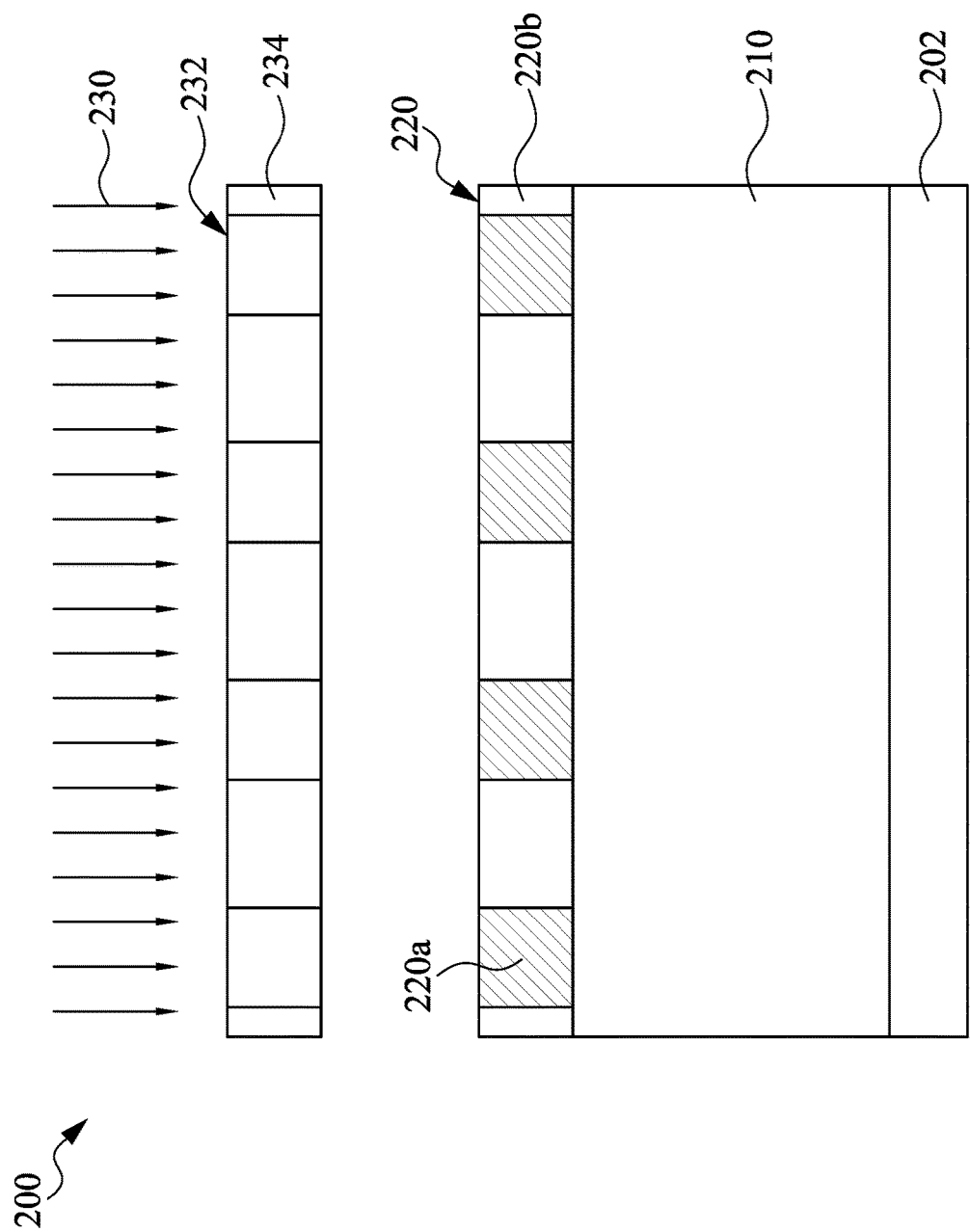
FIG. 2C is a cross-sectional view of the semiconductor structure of FIG. 2B after exposing the photoresist layer to a radiation beam, in accordance with some embodiments.

Referring to FIG. 1, the method 100 proceeds to operation 106, in which the photoresist layer 220 is exposed to a radiation beam 230. FIG. 2C is a cross-sectional view of the semiconductor structure 200 of FIG. 2B after exposing the photoresist layer 220 to the radiation beam 230.

Referring to FIG. 2C, the photoresist layer 220 is exposed to the radiation beam 230 through a photomask 232 having a predefined pattern. The photomask 232 is placed above the photoresist layer 220 and includes blocking portions 234 that do not allow the radiation beam 230 to pass through. The pattern of the photomask 232 is transferred to the photoresist layer 220. Therefore, the photoresist layer 220 is patterned and includes exposed portions 220a and unexposed portions 220b. The radiation causes cleavage of Sn—C bonds and crosslinking of the organo tin cluster compound in the exposed portions 220a of the photoresist layer 220, and results in a stable tin oxide ($SnO_x$) with a high level of resistance to a developer subsequently used.

In some embodiments, the radiation is a deep ultraviolet (DUV) radiation such as KrF excimer laser (248 nm) or ArF excimer laser (193 nm), a EUV radiation (13.5 nm), an e-beam radiation, an x-ray radiation, an ion beam radiation, or other suitable radiations. In some embodiments, the photoresist layer 220 is exposed to an EUV radiation beam with exposure energy from about 10 $mJ/cm^2$ to about 60 $mJ/cm^2$. If the exposure energy is too high, the efficiency of patterning does not change but production cost increases, in some instances. If the exposure energy is too low, the efficiency of patterning is too low, in some instances. In some embodiments, operation 106 is performed in a liquid (immersion lithography) or in a vacuum for EUV lithography and e-beam lithography.

After exposure, the structure of FIG. 2C is baked at a temperature from about 50° C. to about 150° C. for a duration from about 60 seconds to about 360 seconds.

Figure 2D:
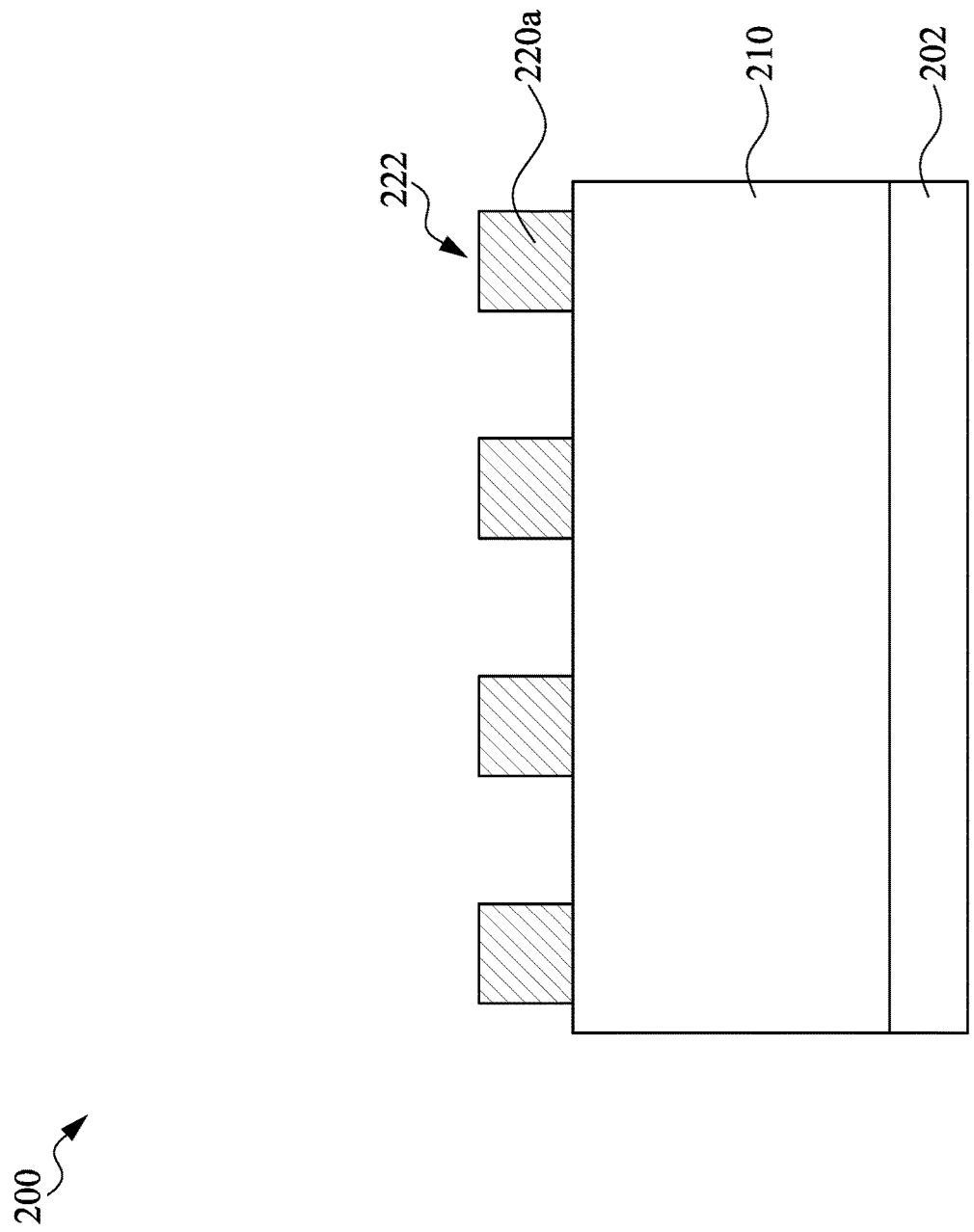
FIG. 2D is a cross-sectional view of the semiconductor structure of FIG. 2C after developing the photoresist layer to form a patterned photoresist layer, in accordance with some embodiments.

Referring to FIG. 1, the method 100 proceeds to operation 108, in which the photoresist layer 220 is developed to form a patterned photoresist layer 222 including a pattern. FIG. 2D is a cross-sectional view of the semiconductor structure 200 of FIG. 2C after developing the photoresist layer 220 to form the patterned photoresist layer 222.

Referring to FIG. 2D, the photoresist layer 220 is developed to form a pattern in the photoresist layer 220. During the developing process, a developer is applied to the photoresist layer. The developer is used to dissolve the unexposed portions 220b of the photoresist layer 220, while leaving the exposed portions 220a of the photoresist layer 220 intact. The unexposed portions 220b of the photoresist layer 220 are, thus, selectively removed from the semiconductor structure 200, and the exposed portions 220a of the photoresist layer 220 remain in the semiconductor structure 200. The remaining exposed portions 220a define a pattern in the patterned photoresist layer 222. Because of the small size of the organotin cluster compounds, the pattern in the patterned photoresist layer 222 is able to define features with pitches from about 24 nm to about 36 nm.

The developer includes alcohols, aromatic hydrocarbons, and the like. Examples of alcohols include, but are not limited to, methanol, ethanol, 1-butanol, and 4-Methyl-2-pentanol. Examples of aromatic hydrocarbons include, but are not limited to, xylene, toluene and benzene. In some embodiments, the developer is selected from at least one of methanol, 4-Methyl-2-pentanol and xylene. In some embodiments, the developing process uses a same solvent (i.e., developer) as the solvent for dissolving a corresponding organotin cluster compound for spin coating. For example, methanol and xylene are able to be used both in the photoresist composition as a solvent for dissolving the organotin cluster compounds and in the developing process as a developer. In some embodiments, the developing process uses a different solvent from the solvent for dissolving a specific organotin cluster compound for spin coating. For example, in instances where 4-methyl-2-pentanol is used as a solvent in the photoresist composition, a different solvent such as 2-heptanone is used as the developer in the developing process.

The developer is applied using any suitable method. In some embodiments, the substrate 202 is dipped into a developer bath. In some embodiments, the developer is sprayed into the photoresist layer 220.

In the present disclosure, the exposure of the photoresist layer 220 results in a stable tin oxide ($SnO_x$) with a high level of resistance to the developer. Thus, the photoresist layer 220 of the present disclosure is able to be made thin without the risk of being removed during photoresist developing stage. The thin photoresist layer enables process simplification through avoidance of intermediate sacrificial inorganic pattern transfer layers that would otherwise be used to supplement the patterned organic-based resists with respect to the mask function.

Figure 2E:
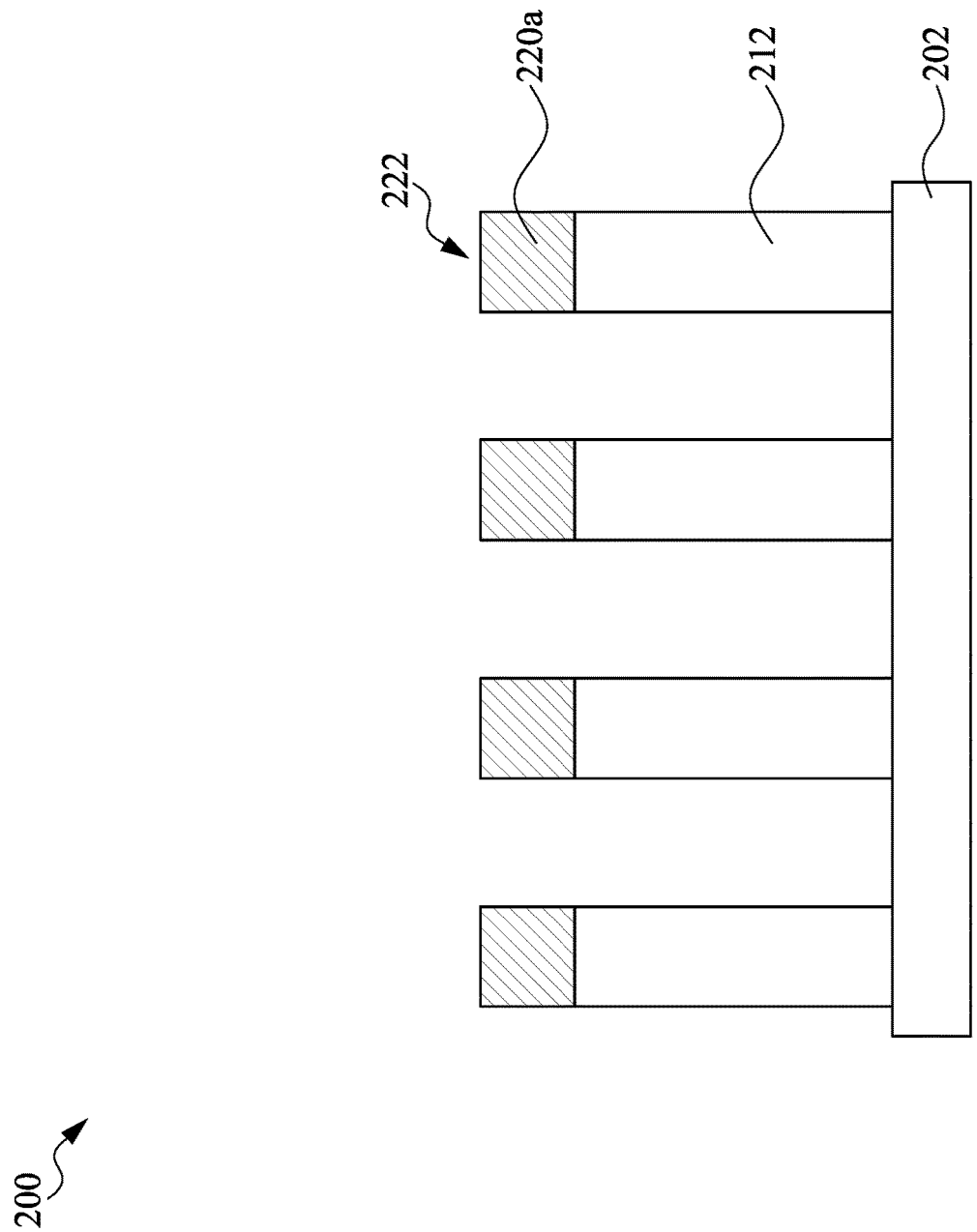
FIG. 2E is a cross-sectional view of the semiconductor structure of FIG. 2D after etching the material layer using the patterned photoresist layer as an etch mask, in accordance with some embodiments.

Referring to FIG. 1, the method 100 proceeds to operation 110, in which the material layer 210 is etched using the patterned photoresist layer 222 as an etch mask. FIG. 2E is a cross-sectional view of the semiconductor structure 200 of FIG. 2D after etching the material layer 210 using the patterned photoresist layer 222 as an etch mask.

Referring to FIG. 2E, the material layer 210 is patterned, using the patterned photoresist layer 222 as an etch mask, to form a patterned material layer 212. The patterned material layer 212 exposes portions of the substrate 202. An anisotropic etch is performed to remove portions of the material layer 210 that are exposed by the patterned photoresist layer 222. The remaining portions of the material layer 210 constitute the patterned the material layer 212. In some embodiments, the anisotropic etch is a dry etch, such as a reactive ion etch or a plasma etch. In some embodiments, the dry etch is implemented by fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), oxygen-containing gas, iodine-containing gas, other suitable gases and/or plasmas, or combinations thereof. In some embodiments, an oxygen plasma is performed to etch the material layer. The anisotropic etch is performed at a temperature from about 250° C. to 450° C. for a duration from about 20 seconds to about 300 seconds.

Tin oxide ($SnO_x$) that provides the patterned photoresist layer 222 possesses a high etching selectivity with respect to the material of the underlying material layer 210, thus is suitable as an etch mask for patterning the material layer 210. The etching selectivity of the material that provides the material layer 210 with respect to tin oxide ($SnO_x$) providing the patterned photoresist layer 222 is from about 5:1 to about 20:1.

Figure 2F:
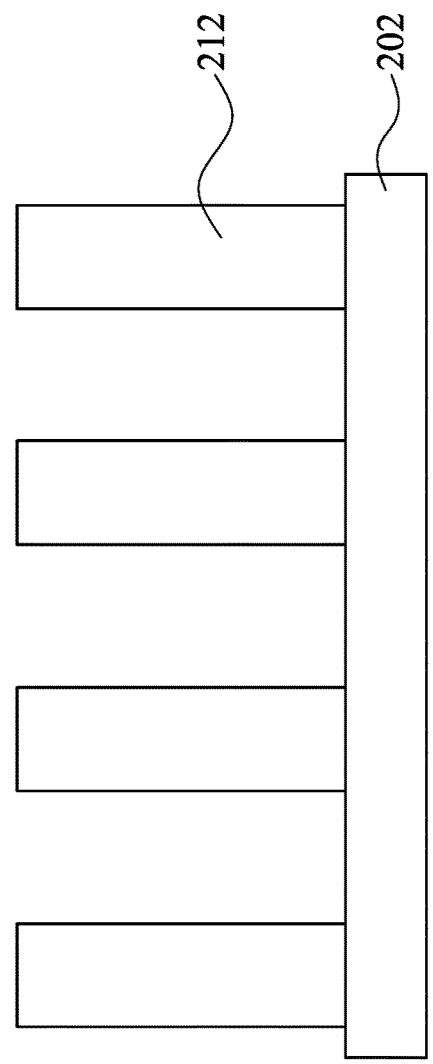
FIG. 2F is a cross-sectional view of the semiconductor structure of FIG. 2E after removing the patterned photoresist layer, in accordance with some embodiments.

Referring to FIG. 1, the method 100 proceeds to operation 112, in which the patterned photoresist layer 222 is removed. FIG. 2F is a cross-sectional view of the semiconductor structure 200 of FIG. 2E after removing the patterned photoresist layer 222 from the structure.

Referring to FIG. 2F, the patterned photoresist layer 222 is removed from the top surfaces of the patterned material layer 212. The patterned photoresist layer 222 is removed by an etch including a dry etch, a wet etch, or combinations thereof. In some embodiments, the patterned photoresist layer 222 is removed by a dry etch using a $Cl_2$ gas. In some embodiments, the etch is performed at a temperature from about room temperature to 80° C. for a duration from about 5 seconds to 120 seconds.

After the patterned photoresist layer 222 is formed, one or more fabrication processes, such as an etching process or an implantation process, may be performed using the patterned material layer 212 as a mask.

EXAMPLE

Example 1

Synthesis of Hexameric n-Butyloxotin 2-Thienylacetate. Butyltin hydroxide oxide hydrate (10 g, 48 mmol) was added to 150 mL of toluene under $N_2$. 2-Thiophene acetic acid (6.81 g, 48 mmol) was added and refluxed for four hours. Upon reflux, the solution became clear. Approximately 25 mL of solvent and water were removed using a Dean-Stark apparatus. The final reaction mixture was left to evaporate, forming large, square-shaped crystals. The crystals were washed with acetonitrile and dissolved in toluene, filtered, and allowed to recrystallize through slow evaporation (yellow solid, yield 7.18 g, 45.0%). $^1$H NMR (400 MHz, $CDCl_3$): δ 7.15~7.13 (m, 6H), 6.90~6.88 (m, 12H), 3.74 (s, 12H), 1.56~1.48 (m, 12H), 1.29~1.17 (m, 24H), 0.82 (t, J=7.2 Hz, 18H); $^{13}$C NMR (100 MHz, CDCl$_3$): δ 177.8, 136.4, 126.3, 126.2, 124.4, 38.2, 27.0, 26.9, 26.3, 13.6.

Example 2

Synthesis of Hexameric n-Butyloxotin 3-Thienylcetate. Butyltin hydroxide oxide hydrate (10 g, 48 mmol) was added to 150 mL of toluene under N$_2$. 3-Thiophene acetic acid (6.81 g, 48 mmol) was added and refluxed for four hours. Upon reflux, the solution became clear. Approximately 25 mL of solvent and water were removed using a Dean-Stark apparatus. The final reaction mixture was left to evaporate, forming large, square-shaped crystals. The crystals were washed with acetonitrile and dissolved in toluene, filtered, and allowed to recrystallize through slow evaporation (brown solid, yield 8.45 g, 53.0%). $^1$H NMR (400 MHz, CDCl$_3$): δ 7.18~7.16 (m, 6H), 7.06 (s, 6H), 6.98~6.97 (m, 6H), 3.56 (s, 12H), 1.49~1.43 (m, 12H), 1.25~1.14 (m, 24H), 0.80 (t, J=7.2 Hz, 18H); $^{13}$C NMR (100 MHz, CDCl$_3$): δ 178.8, 134.7, 128.9, 124.7, 122.2, 38.6, 27.0, 26.9, 26.3, 13.5.

One aspect of this description relates to a compound of formula (I):

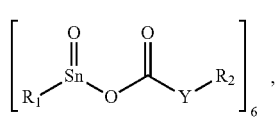

(I)

wherein R$_1$ is alkyl or an optionally substituted aryl, Y is carbonyl or an optionally substituted alkylene, and R$_2$ is substituted aryl or optionally substituted heteroaryl. R$_1$ is alkyl, Y is carbonyl, and R$_2$ is halo-substituted aryl. In some embodiments, R$_1$ is alkyl, Y is alkylene, and R$_2$ is halo-substituted aryl. In some embodiments, R$_1$ is alkyl, Y is alkylene, and R$_2$ is nitro-substituted aryl. In some embodiments, R$_1$ is alkyl, Y is alkylene, and R$_2$ is heteroaryl optionally substituted with alkyl. In some embodiments, the compound has one of the following structures:

Compound 1

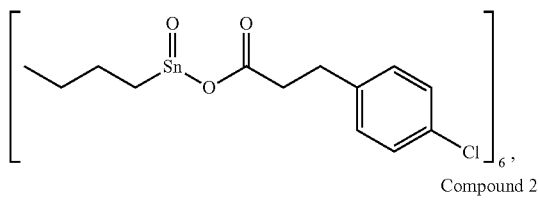

Compound 2

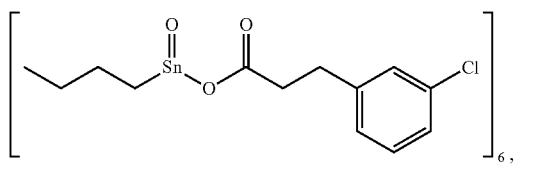

Compound 3

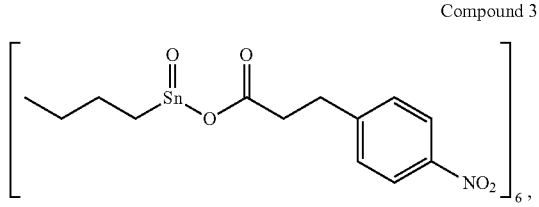

Compound 4

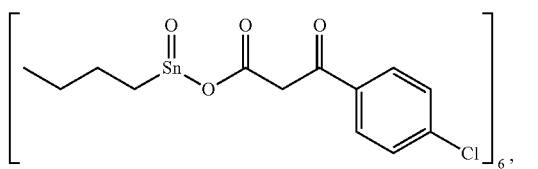

Compound 5

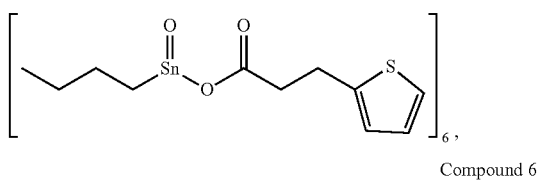

Compound 6

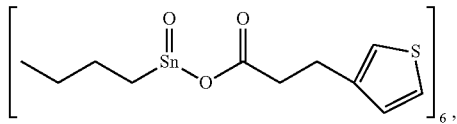

Compound 7

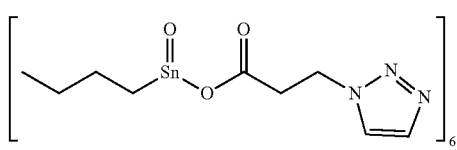

Compound 8

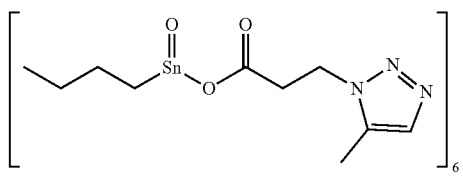

Compound 9

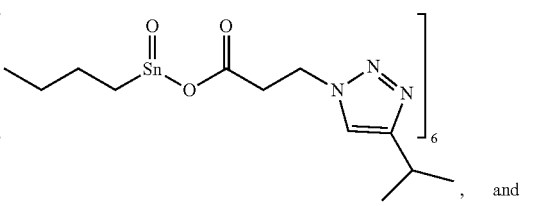

, and

Compound 10

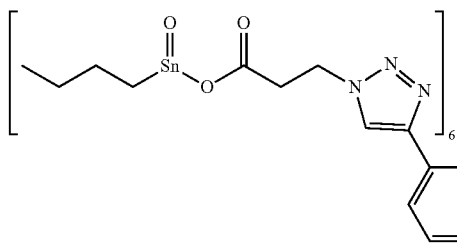

.

Another aspect of this description relates to a photoresist composition. The photoresist composition includes a solvent, and a compound of formula (I):

$$\left[ R_1 \diagdown \underset{\underset{O}{\overset{O}{\parallel}}}{Sn} \diagdown O \diagdown \underset{\underset{}{\overset{O}{\parallel}}}{C} \diagdown Y \diagdown R_2 \right]_6, \quad (I)$$

Wherein $R_1$ is alkyl or an optionally substituted aryl, Y is carbonyl or an optionally substituted alkylene, and $R_2$ is substituted aryl or optionally substituted heteroaryl. In some embodiments, the compound has one of the following structures:

Compound 1

Compound 2

Compound 3

Compound 4

Compound 5

Compound 6

Compound 7

Compound 8

Compound 9

Compound 10

In some embodiments, the solvent includes an alcohol, a hydrocarbon, or combinations thereof. In some embodiments, the solvent includes methanol, 4-methyl-2-pentano, or combinations thereof. In some embodiments, the solvent includes toluene, xylene, or combinations thereof. In some embodiments, an amount of the compound in the photoresist composition is from 0.5 wt. % to about 10 wt. %.

Still another aspect of this description relates to a method of forming a patterned structure. The method includes depositing a photoresist layer over a material layer. The photoresist layer includes a compound of formula (I):

$$\left[ R_1 \diagdown \underset{\underset{O}{\overset{O}{\parallel}}}{Sn} \diagdown O \diagdown \underset{\underset{}{\overset{O}{\parallel}}}{C} \diagdown Y \diagdown R_2 \right]_6, \quad (I)$$

wherein $R_1$ is alkyl or an optionally substituted aryl, Y is carbonyl or an optionally substituted alkylene, and $R_2$ is substituted aryl or optionally substituted heteroaryl. The method further includes exposing the photoresist layer to a predetermined pattern to create a plurality of exposed regions and unexposed regions, and developing the photoresist layer to form a patterned photoresist layer. In some embodiments, depositing the photoresist layer comprises applying a photoresist composition over the material layer, wherein the photoresist composition comprises the compound of formula (I) and a solvent. In some embodiments, applying the photoresist composition includes applying the compound having one of the following structures:

Compound 1

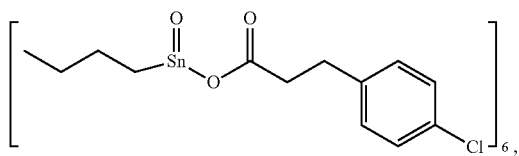

Compound 2

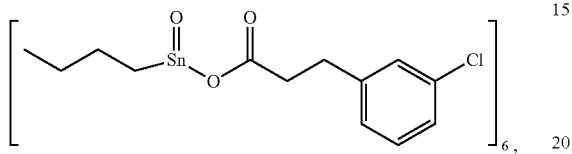

Compound 3

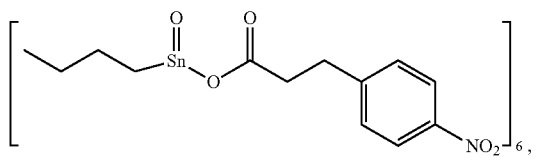

Compound 4

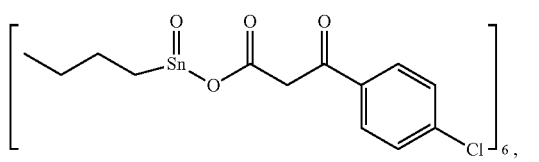

Compound 5

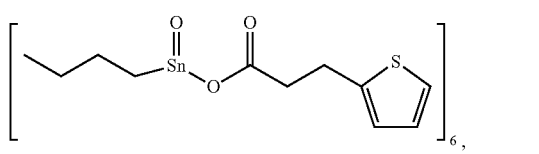

Compound 6

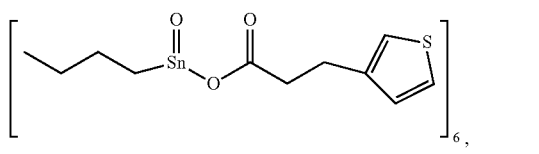

Compound 7

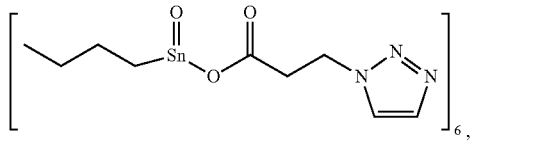

Compound 8

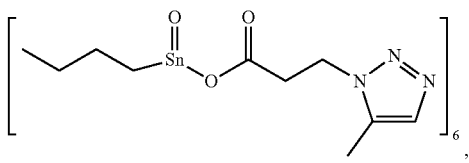

Compound 9

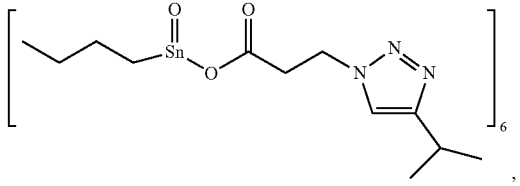

and

Compound 10

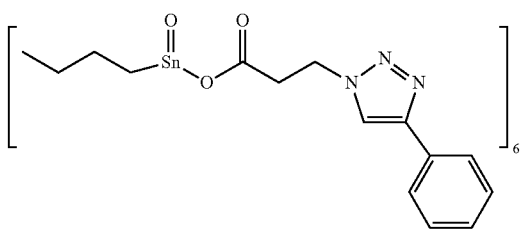

In some embodiments, exposing the photoresist layer to the predetermined pattern comprises exposing the photoresist layer to a radiation beam. In some embodiments, exposing the photoresist layer to the predetermined pattern comprises exposing the photoresist layer to an extreme ultraviolet radiation beam. In some embodiments, developing the photoresist layer comprises applying a developer comprising methanol, xylene, 4-methyl-2-pentanol, or 2-heptanone. In some embodiments, the method of further includes etching the material layer using the patterned photoresist layer as an etch mask. In some embodiments, the method of further includes removing the patterned photoresist layer by a dry etch using a $Cl_2$ gas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A compound having the following structure:

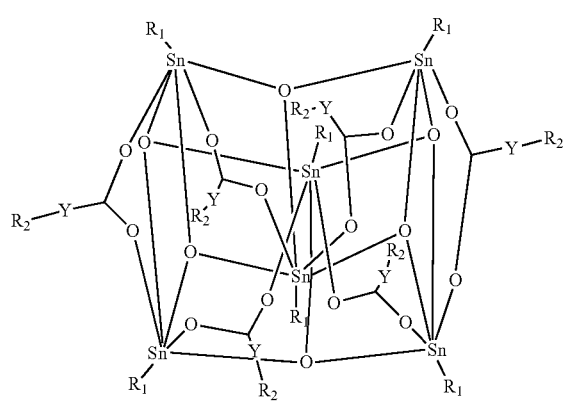

wherein:
R$_1$ is alkyl or aryl;
Y is carbonyl or alkylene; and
R$_2$ is aryl or heteroaryl.

2. The compound of claim 1, wherein R$_1$ is alkyl, Y is carbonyl, and R$_2$ is halo-substituted aryl.

3. The compound of claim 1, wherein R$_1$ is alkyl, Y is alkylene, and R$_2$ is halo-substituted aryl.

4. The compound of claim 1, wherein R$_1$ is alkyl, Y is alkylene, and R$_2$ is nitro-substituted aryl.

5. The compound of claim 1, wherein R$_1$ is alkyl, Y is alkylene, and R$_2$ is heteroaryl optionally substituted with alkyl.

6. The compound of claim 1, wherein:
R$_1$ is butyl;
Y is carbonyl or methylene; and
R$_2$ has one of the following structures:

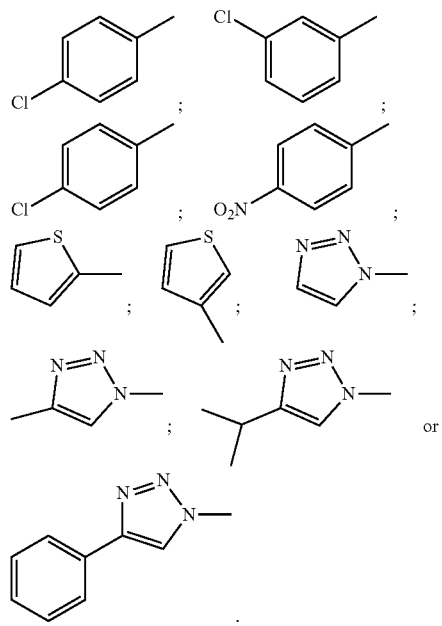

7. A photoresist composition, comprising:
a solvent; and
a compound having the following structure:

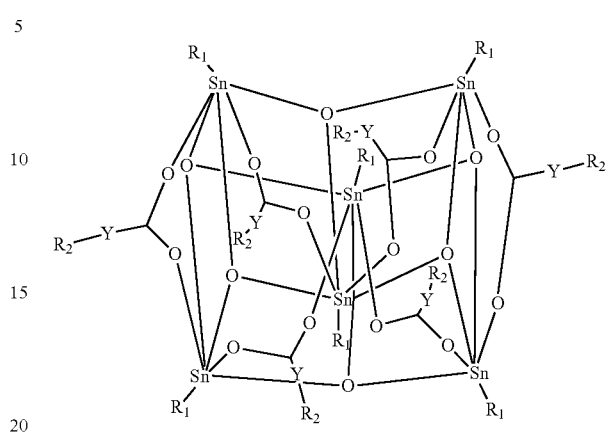

wherein:
R$_1$ is alkyl or aryl;
Y is carbonyl or alkylene; and
R$_2$ is aryl or heteroaryl.

8. The photoresist composition of claim 7, wherein:
R$_1$ is butyl;
Y is carbonyl or methylene; and
R$_2$ has one of the following structures:

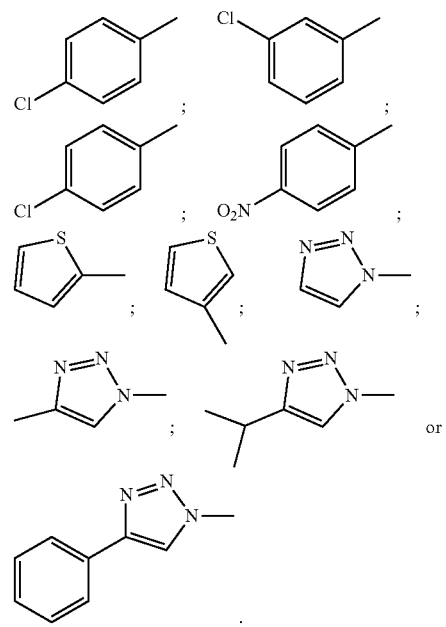

9. The photoresist composition of claim 7, wherein the solvent comprises an alcohol, a hydrocarbon, or combinations thereof.

10. The photoresist composition of claim 7, wherein the solvent comprises methanol, 4-methyl-2-pentano, or combinations thereof.

11. The photoresist composition of claim 7, wherein the solvent comprises toluene, xylene, or combinations thereof.

12. The photoresist composition of claim 7, wherein an amount of the compound in the photoresist composition is from 0.5 wt. % to about 10 wt. %.

13. A photoresist layer comprising a compound having the following structure:

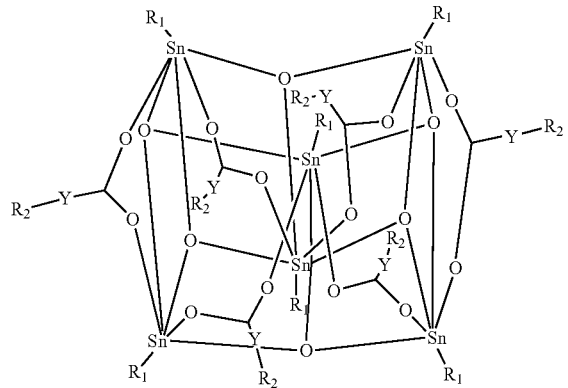

wherein:
$R_1$ is alkyl or aryl;
Y is carbonyl or alkylene; and
$R_2$ is aryl or heteroaryl.

14. The photoresist layer of claim 13, wherein $R_1$ is methyl, ethyl or butyl.

15. The photoresist layer of claim 13, wherein Y is methylene, ethylene or propylene.

16. The photoresist layer of claim 13, wherein $R_2$ has one of the following structures:

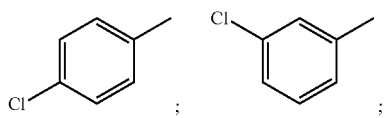

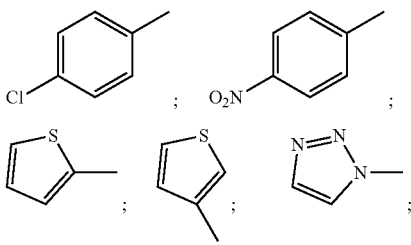

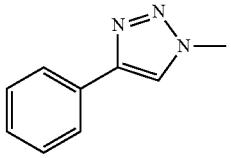

or

17. The photoresist layer of claim 13, wherein the compound has a dimension ranging from 0.5 nm to 10 nm.

18. The photoresist layer of claim 13, wherein the compound has a dimension ranging from 0.5 nm to 1 nm.

19. The photoresist layer of claim 13, wherein the photoresist layer is composed of the compound.

20. The photoresist layer of claim 13, wherein a thickness of the photoresist layer is from 10 nm to 100 nm.

* * * * *